United States Patent [19]

Nagasaka et al.

[11] Patent Number: 4,985,470

[45] Date of Patent: Jan. 15, 1991

[54] PHOTOPOLYMERIZABLE COMPOSITIONS

[75] Inventors: Hideki Nagasaka, Yamato; Noriaki Takahashi, Tokyo, both of Japan

[73] Assignee: Mitsubishi Kasei Corporation, Tokyo, Japan

[21] Appl. No.: 880,120

[22] Filed: Jun. 30, 1986

[30] Foreign Application Priority Data

Sep. 27, 1982 [JP] Japan ..................... 57-168088

[51] Int. Cl.$^5$ ............... G03F 7/031; G03F 7/032; G03F 2/50; G03F 4/40
[52] U.S. Cl. ............................... 522/26; 430/281; 430/285; 430/288; 430/915; 430/920; 430/922; 430/926; 522/104; 522/181; 522/182
[58] Field of Search ............. 522/16, 26; 430/920, 430/922, 926

[56] References Cited

U.S. PATENT DOCUMENTS

| | | | |
|---|---|---|---|
| 3,479,185 | 11/1969 | Chambers | 522/16 |
| 3,652,275 | 3/1972 | Baum et al. | 204/159.16 |
| 4,252,887 | 2/1981 | Dessauer | 430/920 |
| 4,346,162 | 8/1982 | Abele | 430/920 |
| 4,358,529 | 11/1982 | Abele | 430/920 |
| 4,410,621 | 10/1983 | Wada et al. | 430/920 |
| 4,419,438 | 12/1983 | Etoh et al. | 430/920 |
| 4,459,349 | 7/1984 | Tanaka et al. | 430/920 |

FOREIGN PATENT DOCUMENTS 21401 2/1982 Japan .

OTHER PUBLICATIONS

Derwent Abstract 82-20472E/11, Feb. 1982.

*Primary Examiner*—Marion E. McCamish
*Assistant Examiner*—Arthur H. Koeckert
*Attorney, Agent, or Firm*—Oblon, Spivak, McClelland, Maier & Neustadt

[57] ABSTRACT

A photopolymerizable composition which comprises an addition-polymerizable compound having at least one ethylenically unsaturated double bond and a photopolymerization initiator system, characterized in that said photopolymerization initiator system essentially consists of:

(a) a p-dialkylaminostyrene derivative or p-dialkylaminophenylbutadiene derivative represented by the general formula

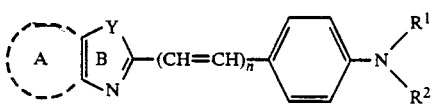

wherein $R^1$ and $R^2$ independently represent an alkyl group; Y represents a divalent atom or atomic group selected from the group consisting of —O—, —S— and —CH=CH— and forms aromatic heterocyclic ring B together with trivalent nitrogen atom, and ring A represents a benzene ring or naphthalene ring condensed with ring B, and n is 1 or 2;

(b) a hexaarylbiimidazole; and (c) a thiol compound represented by the general formula

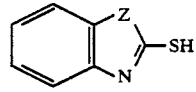

wherein Z represents a divalent atom or atomic group selected from the group consisting of —O—, —S—, —NH— and

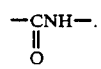

17 Claims, No Drawings

PHOTOPOLYMERIZABLE COMPOSITIONS

This application is a continuation of application Ser. No. 529,721 filed Sept. 6, 1983, now abandoned.

BACKGROUND OF THE INVENTION

1. Field of the Invention

This invention relates to photopolymerizable compositions. More particularly, it relates to photopolymerizable compositions which show high sensitivity to a light source of a visible light range.

2. Description of the Prior Art

A number of image forming methods utilizing photopolymerizable systems are known. For instance, there is known a method of forming an image whereby a photopolymerizable composition which comprises a compound having an addition-polymerizable ethylenically unsaturated bond and a photopolymerization initiator, and optionally organic polymer binders, thermal polymerization inhibitors, colorants, plasticizers and the like is prepared; this photopolymerizable composition is applied onto a support either in the absence of any solvent or after dissolution in solvents, thereby forming a photosensitive material having a photopolymerizable composition layer thereon; and the photosensitive material is exposed to light in a desired image pattern, so that the exposed portions are polymerized and cured, and the remaining non-exposed portions are dissolved out and removed, thereby forming a cured relief image Alternatively, a photosensitive material is made by forming a photosensitive layer between two supports at least one of which is transparent; the photosensitive material is exposed in an imagewise pattern from the transparent support side, thereby causing the photosensitive layer to vary in adhesion strength; and thereafter the supports are separated from each other to form the intended image on the support. Still alternatively, there is a method of image formation which utilizes a change in toner adherence of a photopolymerizable composition layer on exposure to light.

The photopolymerization initiators for the photopolymerizable compositions used in the above methods are, for example, benzoin, benzoin alkyl ethers, benzophenone, anthraquinone, benzil, and Michler's ketone. However, these photopolymerization initiators have much lower photopolymerization initiating ability to a light source of the visible light region exceeding 400 nm than to a light source of the ultraviolet region below 400 nm. This places a great limit on the range of application of photopolymerizable composition comprising these initiators.

Several photopolymerization systems which are sensitive to visible light have been heretofore proposed In the past, it was described in U.S. Pat. No. 2,850,445 that certain kinds of photo-reducible dyes, e.g. Rose Bengal, Eosine, erythrosine, riboflavin and the like, had an effective visible light sensitivity. Since then, improvements have been reported including composite initiator systems comprising dyes and aliphatic amines (Japanese Patent Publication No. 20189/1969, systems of hexaarylbiimidazoles, radical generators, and dyes (Japanese Patent Publication No. 37377/1970, systems of hexaarylbiimidazoles and (p-dialkylaminobenzylidene) ketones (U.S. Pat. Nos. 3,652,275 and 4,162,162), systems of cyclic-cis-alphadicarbonyl compounds and dyes (U.S. Pat. No. 3,756,827), and systems of substituted triazines and merocyanine dye (Japanese Patent Application Laid-open No. 151024/1979). These systems are effective to visible light but are not satisfactory with regard to their photosensitive velocity. Thus, there is a continuing need for further improvements.

Some of the present inventors have already proposed photopolymerizable compositions which are highly sensitive to visible light (Japanese Patent Application Laid-open No. 21401/1982 and Japanese Patent Application Laid-open No. 19315/1983).

SUMMARY OF THE INVENTION

It has now been found that when a specific type of thiol compound is used in combination with a specific type of photopolymerization initiator, a photopolymerizable composition of improved sensitivity can be obtained. This composition can be conveniently applied, for example, to the field of plate making by direct irradiation of a laser beam. This permits the shortened time of making one plate and easy plate-making by a laser beam of low output power. The present invention is accomplished based on the above finding.

The subject matter of the present invention resides in a photopolymerizable composition which comprises an addition polymerizable compound having at least one ethylenically unsaturated double bond and a photopolymerization initiator system, characterized in that said photopolymerization initiator system essentially consists of:

(a) a p-dialkylaminostyrene derivative or p-dialkylaminophenylbutadiene derivative represented by the general formula

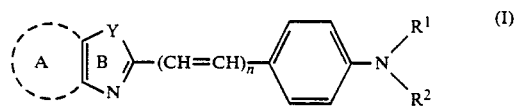

wherein $R^1$ and $R^2$ independently represent an alkyl group; Y represents a divalent atom or atomic group selected from the group consisting of —O—, —S—, and —CH=CH— and forms aromatic heterocyclic ring B together with trivalent nitrogen atom, and ring A represents a benzene ring or naphthalene ring condensed with ring B, and n is 1 or 2;

(b) a hexaarylbiimidazole; and (c) a thiol compound represented by the general formula

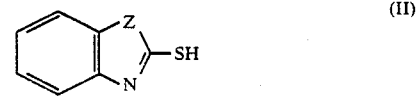

wherein Z represents a divalent atom or atomic group selected from the group consisting of —O—, —S—, —NH— and

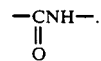

DETAILED DESCRIPTION OF THE PREFERRED EMBODIMENTS

The addition-polymerizable compound having at least one ethylenically unsaturated double bond which is one of the essential components in the photopolymerizable composition of the present invention is a monomer having an ethylenically unsaturated double bond or a polymer having an ethylenically unsaturated double bond in the side or main chain. The monomer or polymer should be cured and rendered substantially insoluble by addition polymerization by the action of a photodecomposed product from a photopolymerization initiator, which is the second essential component, when the photopolymerizable composition is subjected irradiation of actinic light. The term "monomer" used herein is intended to mean a concept relative to so-called polymer materials and cover, aside from monomers in a strict sense, dimers, trimers, and oligomers.

Examples of the monomers having the ethylenically unsaturated double bond include unsaturated carboxylic acids, esters of unsaturated carboxylic acids and aliphatic polyhydroxy compounds, esters of unsaturated carboxylic acids and aromatic polyhydroxy compounds, and esters obtained by the esterification reaction of unsaturated carboxylic acids, polycarboxylic acids, and polyhydroxy compounds such as aliphatic polyhydroxy compounds, aromatic polyhydroxy compounds and the like.

The esters of aliphatic polyhydroxy compounds and unsaturated carboxylic acids are, for example, acrylates such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, glycerol acrylate and the like; methacrylates such as triethylene glycol dimethacrylate, trimethylolpropane trimethacrylate, trimethylolethane trimethacrylate, pentaerythritol dimethacrylate, pentaerythritol trimethacrylate, pentaerythritol tetramethacrylate, dipentaerythritol dimethacrylate, dipentaerythritol trimethacrylate, dipentaerythritol tetramethacrylate and the like; itaconates such as ethylene glycol diitaconate, tetramethylene glycol diitaconate, pentaerythritol triitaconate and the like; crotonates such as ethylene glycol dicrotonate, diethylene glycol dicrotonate, pentaerythritol tetracrotonate and the like; and maleates such as ethylene glycol dimaleate, triethylene glycol dimaleate, pentaerythritol dimaleate and the like.

The esters of aromatic polyhydroxy compounds and unsaturated carboxylic acids include hydroquinone diacrylate, hydroquinone dimethacrylate, resorcin diacrylate, resorcin dimethacrylate, pyrogallol triacrylate, and the like.

The esters obtained by the esterification of unsaturated carboxylic acids, polycarboxylic acids, and polyhydroxy compounds are not necessarily single products. Illustrative of such esters are condensates of acrylic acid, phthalic acid and ethylene glycol; condensates of acrylic acid, maleic acid and diethylene glycol; condensates of methacrylic acid, terephthalic acid and pentaerythritol; condensates of acrylic acid, adipic acid, butanediol and glycerol.

Examples of other compounds having an ethylenically unsaturated double bond used in the present invention include acrylamides such as ethylene bisacrylamide, allyl esters such as diallyl phthalate, vinyl group-containing compounds such as divinyl phthalate, and the like.

The polymers having an ethylenically unsaturated bond in the main chain thereof include, for example, polyesters obtained by polycondensation between unsaturated dicarboxylic acids and dihydroxy compounds; polyamides obtained by polycondensation between unsaturated dicarboxylic acids and diamines, and the like.

The polymers having an ethylenically unsaturated bond in the side chain thereof include polycondensation products of dicarboxylic acids having an unsaturated bond at the side chain thereof, e.g. itaconic acid, propylidenesuccinic acid, ethylidenemalonic acid and the like with dihydroxy or diamine compounds. Polymers having a hydroxy group or a halogenated methyl group in the side chain thereof such as, for example, polymers obtained by polymerization reaction between polyvinyl alcohol, poly(2-hydroxyethylmethacrylate), polyepichlorohydrin or the like and unsaturated carboxylic acids such as (meth)acrylic acid, crotonic acid or the like may also be conveniently used.

Of these addition-polymerizable compounds having at least ethylenically unsaturated double bond, the monomers of acrylates or methacrylates are preferably used.

The photopolymerization initiator which is the second essential ingredient of the photopolymerizable composition according to the present invention are described below. The photopolymerization initiator systems must produce radicals on irradiation of actinic light and bring about the addition polymerization reaction of the compound having the ethylenically unsaturated bond. The initiator system of the present invention consists of a combination of three ingredients. The first ingredient (a) is a p-dialkylaminostyrene derivative or p-dialkylaminophenylbutadiene derivative represented by the afore-mentioned general formula (I) wherein $R^1$ and $R^2$ is preferably methyl or ethyl, respectively. Examples of such derivative include p-dialkylaminostyrene derivatives such as 2-(p-dimethylaminostyryl)benzothiazole, 2-(p-diethylaminostyryl) benzothiazole (hereinafter referred to as "a-1"), 2-(p-dimethylaminostyryl)benzoxazole (hereinafter referred to as "a-2"), 2-(p-diethylaminostyryl)benzoxazole, 2-(p-dimethylaminostyryl)benzo[4,5]benzothiazole (hereinafter referred to as "a-3"), 2-(p-diethylaminostyryl)benzo[4,5]benzothiazole (hereinafter referred to as "a-4"), 2-(p-diethylaminostyryl)benzo[6,7]benzothiazole, 2-(p-dimethylaminostyryl)quinoline (hereinafter referred to as "a-5"), 2-(p-diethylaminostyryl)quinoline, 2-(p-diethylaminostyryl)benzo[4,5]benzoxazole, and the like; and dialkylaminophenylbutadiene derivatives such as 2-[4-(p-dimethylaminophenyl)-1,3-butadienyl]benzothiazole (hereinafter referred to as "a-6"), 2-[4-(p-diethylaminophenyl)-1,3-butadienyl]benzothiazole, 2-[4-(p-di-n-butylaminophenyl)-1,3-butadienyl]benzothiazole, 2-[4-(p-dimethylaminophenyl)-1,3-butadienyl]benzo[6,7-]benzothiazole (hereinafter referred to as "a-7"), 2-[4-(p-diethylaminophenyl)-1,3-butadienyl]benzo[4,5]benzothiazole (hereinafter referred to as "a-8"), and the like.

These compounds are prepared by condensation reaction between a corresponding p-dialkylaminobenzaldehyde or p-dialkylaminocinnamic aldehyde and a 2-methylheterocylic compound, for example, according to the method described in Zhur. Obshchei. Khim 26, 2891 - 6 (1956).

The second ingredient (b) is a hexaarylbiimidazole.

This compound is also called 2,4,5-triarylimidazolyl dimer which has such a structure that two imidazoles are combined through one covalent bond.

The aryl groups are preferably phenyl groups. The phenyl group may have a substituent. Especially, hexaphenylbiimidazole in which the phenyl groups at 2 and 2' positions on the imidazole ring are substituted at the ortho position with fluorine, chlorine, bromine, nitro or methyl are preferred from the standpoint of thermal stability and photoreaction velocity.

Preferred examples of the hexaarylbiimidazoles include 2,2'-bis(o-chlorophenyl)-4,4',5,5'-tetraphenylbiimidazole (hereinafter referred to as "b-1"), 2,2'-bis(o-bromophenyl)-4,4',5,5'-tetraphenylbiimidazole (hereinafter referred to as "b-2"), 2,2'-bis(o,p-dichlorophenyl)-4,4',5,5'-tetraphenylbiimidazole (hereinafter referred to as "b-3"), 2,2'-bis(o-chlorophenyl-4,4',5,5'-tetra(m-methoxyphenyl)biimidazole, 2,2'bib(o,o'-dichlorophenyl)-4,4',5,5'-tetraphenylbiimidazole (hereinafter referred to as "b-4"), 2,2'-bis(o-nitrophenyl)-4,4',5,5'-tetraphenylbiimidazole (hereinafter referred to as "b-5"), 2,2'-bis(o-methylphenyl)-4,4',5,5'tetraphenylbiimidazole (hereinafter referred to as "b-6"), and the like.

These hexaarylbiimidazoles are readily prepared according to the methods described, for example, in Bull. Chem. Soc. Japan, 33, 565 (1960) and J. Org. Chem. 36 [16] 2262 (1971).

It has also now been found that the sensitivity could be improved by several times by adding a specific thiol compound in addition to the above two ingredients.

Thiol compounds are known as a typical radical chain transfer agent. References 1-3 appearing hereinafter demonstrate effects of the introduction into the conventional, typical photopolymerization initiator systems of the thiol compound on sensitivity. From this, it can be seen that the sensitivity is remarkably improved only when thiol compounds are added to a specific type of polymerization initiator system.

The thiol compounds as the ingredient (c) of the present invention are those represented by the foregoing general formula (II). Specific examples of the compounds include 2-mercaptobenzothiazole (hereinafter referred to as "c-1"), 2-mercaptobenzoxazole (hereinafter referred to as "c-2"), 2-mercaptobenzimidazole (hereinafter referred to as "c-3"), 2-mercapto-4(3H)quinazolinone (hereinafter referred to as "c-4"), and the like.

The amounts of the ingredients (a), (b) and (c) used in the photopolymerizable composition according to the present invention are, respectively, 0.1-10 parts by weight, preferably 1-7 parts by weight for the ingredient (a), 0.5-30 parts by weight, preferably 2-15 parts by weight for the ingredient (b), and 0.1-20 parts by weight, preferably 1-15 parts by weight for the ingredient (c), all based on 100 parts by weight of the ethylenically addition-polymerizable compound.

In addition to the above ingredients, the photopolymerizable composition of the present invention may further contain organic polymer materials as a binder in order to modify the composition and improve physical properties after photo-curing. The binder is properly chosen depending on the purpose of the improvement in properties such as compatibility, film-forming property, developability, and adhesiveness. For instance, the improvement in developability of an aqueous system can be achieved by the use of (meth)acrylic acid copolymers, itaconic acid copolymers, partially esterified maleic acid copolymers, acidic cellulose-modified products having carboxyl groups at the side chain thereof, polyethylene oxide, polyvinylpyrrolidone, and the like. In order to improve the film strength and adhesiveness, a polyether of epichlorohydrin and bisphenol A, soluble nylons, polyalkyl methacrylates such as polymethyl methacrylate, polyalkyl acrylate, copolymers of alkyl methacrylates and acrylonitrile, acrylic acid, methacrylic acid, vinyl chloride, vinylidene chloride, styrene or the like, copolymers of acrylonitrile and vinyl chloride or vinylidene chloride, copolymers of vinylidene chloride, chlorinated polyolefins or vinyl chloride and vinyl acetate, polyvinyl acetate, copolymers of acrylonitrile and styrene, copolymers of acrylonitrile and butadiene or styrene, polyvinyl alkyl ethers, polyvinyl alkyl ketones, polystyrene, polyamides, polyurethanes, polyethylene terephthalate isophthalate, acetyl cellulose, polyvinyl butyral, and the like. These binders may be added in an amount in the range of not more than 500%, preferably not more than 200% based on the weight of the compound having ethylenic bond.

The photopolymerizable composition of the present invention may further comprise thermal polymerization inhibitors, colorants, plasticizers, surface protecting agents, smoothing agents, application aids, and the like, if necessary.

The thermal polymerization inhibitors include, for example, hydroquinone, p-methoxyphenyl, pyrogallol, catechol, 2,6-di-t-butyl-p-cresol, beta-naphthol, and the like. The colorants include, for example, pigments such as phthalocyanine pigments, azo pigments, carbon black, titanium oxide and the like, and dyes such as Ethyl Violet, Crystal Violet, Azo dyes, anthraquinone dyes, cyanine dyes and the like. These thermal polymerization inhibitors and colorants are conveniently used in amounts of from 0.01 to 3% and from 0.1 to 20%, respectively, both based on the total weight of the ethylenically unsaturated double bond-bearing compound and the binder. The plasticizers include, for example, dioctyl phthalate, didodecyl phthalate, triethylene glycol dicaprylate, dimethyl glycol phthalate, tricresyl phosphate, dioctyl adipate, dibutyl sebacate, triacetyl glycerol, and the like. The plasticizers are added in an amount not more than 5% based on the total weight of the ethylenically unsaturated double bond-bearing compound and the binder.

The photopolymerizable composition of the present invention may be used to form a photosensitive material in the absence of solvents, or may be dissolved in suitable solvents to give a solution, followed by applying it onto a support and drying to obtain a photosensitive material. The solvents are, for example, methyl ethyl ketone, cyclohexanone, butyl acetate, amyl acetate, ethyl propionate, toluene, xylene, monochlorobenzene, carbon tetrachloride, trichloroethylene, trichloroethane, dimethylformamide, methyl cellosolve, ethyl cellosolve, tetrahydrofuran, pentoxone, and the like.

Supports to which the photopolymerizable composition of the present invention is applied for the formation of a photosensitive material thereon includes, for example, sheets of metals such as aluminium, magnesium, copper, zinc, chromium, nickel, iron and the like, and alloys thereof, paper sheets such as high quality papers, art papers, release papers and the like, sheets of inorganic materials such as glasses and ceramics, sheets of polymers such as polyethylene terephthalate, polyethylene, polymethyl methacrylate, polyvinyl chloride, vinyl chloridevinylidene chloride copolymers, polystyrene, 6-nylon, cellulose triacetate, and cellulose acetate butyrate, and the like.

The photopolymerizable composition of the present invention may be treated by known techniques for the prevention of disadvantageous effects of oxygen, such as lowered sensitivity, deterioration of storage stability and the like. For instance, a photosensitive layer may be covered with a releasable transparent cover sheet, or a coating layer of a wax-like material or a water-soluble polymer which has a small oxygen permeability.

The light sources applicable to the composition of the present invention include general-purpose light sources irradiating ultraviolet and visible light with wavelengths not less than 180 nm, e.g. carbon arc lamps, high pressure mercury lamps, xenon lamps, metal halide lamps, fluorescent lamps, tungsten lamps, argon ion lasers, and the like.

The photopolymerizable composition of the present invention has applicability in a wide range of fields and can be used in the preparation of printing plates for use in a lithograph, intaglio and relief printing or the like; photoresists for the preparation of printed circuit or IC and dry films; image formation of relief images and reproduction of images; photocurable inks; paints; adhesives or the like. Especially, they are useful in the field where a light source for visible light is applied.

Having generally described the invention, a more complete understanding can be obtained by reference to certain specific examples, which are included for purposes of illustration only and are not intended to be limiting unless otherwise specified.

The abbreviations for the respective ingredients used in the examples, comparative examples and references correspond to those compounds indicated before. The amounts are expressed by weight percent based on the total weight of an ethylenic monomer and a binder.

EXAMPLE 1 AND COMPARATIVE EXAMPLES 1–3

1.0 g of a methyl methacrylate/methacrylic acid copolymer (binder) obtained by 20 mol % partial hydrolysis of polymethyl methacrylate BR-83 (product by Mitsubishi Rayon Co., Ltd.) by a usual manner, 1.0 g of trimethylolpropane triacrylate (product by Osaka Organic Chem. Ind. Co., Ltd.), 6 mg of p-methoxyphenol and 6 mg of Victoria Pure Blue BOH (product by Hodogaya Chemical Co., Ltd.) were dissolved in 18 g of methyl ethyl ketone, thereby obtaining a stock solution for photosensitive solution.

This stock solution was admixed with ingredient additives indicated in Table 1, and was applied to an aluminum sheet, which had been sand-blasted and anodized, by the use of a whirler so that a dry thickness was 2 μm, followed by drying at 80° C. for 5 minutes. Thereafter, an aqueous polyvinyl alcohol solution was applied onto the coating surface so that an overcoat layer with a dry thickness of 3 μm was formed, thereby obtaining a sample. A step tablet (product of Eastman Kodak Co.) was superposed on the sample in a vacuum printing frame, followed by exposing to light. The sample was exposed to light ray (light intensity of 1.0 mW/cm2) with a wavelength of about 490 nm which had been obtained from a xenon lamp after passing through a color glass filter Y-47 and an interference filter KL-49 (both made by Toshiba Glass Co., Ltd.) for 10 seconds. After completion of the exposure, the exposed sample was developed with an aqueous solution containing 9 wt. % of butyl cellosolve and 1 wt. % of sodium silicate. The sensitivity was determined in terms of step number of the resultant photo-cured image. The results are shown in Table 1.

TABLE 1

|  | Ingredient (a) [amount] | Ingredient (b) [amount] | Ingredient (c) [amount] | Sensitivity |
| --- | --- | --- | --- | --- |
| Example 1 | a-4 [2.5%] | b-1 [5%] | c-1 [5%] | 7 (step) |
| Comp. Ex. 1 | a-4 [2.5%] | b-1 [5%] | — | 3 |
| Comp. Ex. 2 | a-4 [2.5%] | — | c-1 [5%] | 0 |
| Comp. Ex. 3 | — | b-1 [5%] | c-1 [5%] | 0 |

The sample of Example 1 was found to have a sensitivity times or more as high as the samples of Comparative Examples 1 through 3.

EXAMPLES 2–7 AND COMPARATIVE EXAMPLES 4–7

Example 1 was repeated except that 5 wt. % of b-2 was added to and dissolved in the stock solution of Example 1 as the ingredient (b), and compounds indicated in Table 2 were added as the ingredients (a) and (c). The resulting samples were evaluated under the same conditions in Example 1.

TABLE 2

|  | Ingredient (a) [amount] | Ingredient (c) [amount] | Sensitivity |
| --- | --- | --- | --- |
| Example 2 | a-4 [2.5%] | c-2 [5%] | 7 (step) |
| Example 3 | a-8 [2.5%] | c-2 [5%] | 7 |
| Example 4 | a-7 [2.5%] | c-2 [5%] | 6.5 |
| Example 5 | a-3 [2.5%] | c-2 [5%] | 7 |
| Example 6 | a-4 [2.5%] | c-3 [5%] | 6.5 |
| Example 7 | a-4 [2.5%] | c-4 [2%] | 5.5 |
| Comp. Ex. 4 | a-4 [2.5%] | — | 3 |
| Comp. Ex. 5 | a-8 [2.5%] | — | 2.5 |
| Comp. Ex. 6 | a-7 [2.5%] | — | 3 |
| Comp. Ex. 7 | a-3 [2.5%] | — | 2.5 |

EXAMPLES 8–12 AND COMPARATIVE EXAMPLES 8–12

Example 1 was repeated except that 5 wt. % of b-2 as the ingredient (b) was added to and dissolved in the stock solution obtained in Example 1, and compounds indicated in Table 3 were added, as the ingredients (a) and (c), to the solution, and that the sample was exposed to a light ray with a wavelength of 436 nm (light intensity of 0.065 mW/cm$^2$) which had been obtained from a high pressure mercury lamp after passage through a color glass filter L-42 and an interference filter KL-43 (both made by Toshiba Glass Co., Ltd.) for 50 seconds. The results are shown in Table 3.

TABLE 3

|  | Ingredient (a) [amount] | Ingredient (c) [amount] | Sensitivity |
| --- | --- | --- | --- |
| Example 8 | a-4 [2.5%] | c-2 [5%] | 5.5 (step) |
| Example 9 | a-5 [2.5%] | c-2 [5%] | 4 |
| Example 10 | a-2 [2.5%] | c-2 [5%] | 5.5 |
| Example 11 | a-1 [2.5%] | c-2 [5%] | 5 |
| Example 12 | a-6 [2.5%] | c-2 [5%] | 5 |
| Comp. Ex. 8 | a-4 [2.5%] | — | 2 |
| Comp. Ex. 9 | a-5 [2.5%] | — | 0 |
| Comp. Ex. 10 | a-2 [2.5%] | — | 2 |
| Comp. Ex. 11 | a-1 [2.5%] | — | 1 |
| Comp. Ex. 12 | a-6 [2.5%] | — | 1 |

EXAMPLES 13-16 AND COMPARATIVE EXAMPLES 13 and 14

Example 1 was repeated except that 2.5 wt. % of the ingredient (a), and compounds indicated in Table 4 as the ingredients (b) and (c) were added to the stock solution used in Example 1. The results are shown in Table 4.

TABLE 4

|  | Ingredient (b) [amount] | Ingredient (c) [amount] | Sensitivity |
|---|---|---|---|
| Example 13 | b-3 [5%] | c-1 [5%] | 7 (step) |
| Example 14 | b-4 [5%] | c-1 [5%] | 4.5 |
| Example 15 | b-5 [5%] | c-1 [5%] | 5.5 |
| Example 16 | b-6 [5%] | c-1 [5%] | 5 |
| Comp. Ex. 13 | b-4 [5%] | — | 1 |
| Comp. Ex. 14 | b-6 [5%] | — | 1.5 |

EXAMPLES 17-20

Example 1 was repeated using, instead of trimethylolpropane triacrylate, ethylenic monomers indicated in Table 5. The results are shown in Table 5.

TABLE 5

|  | Ethylenic Monomer | Sensitivity |
|---|---|---|
| Example 17 | pentaerythritol triacrylate | 7 (step) |
| Example 18 | pentaerythritol tetramethacrylate | 7 |
| Example 19 | 1,6-hexanediol diacrylate | 6.5 |
| Example 20 | glycerol monoacrylate | 6 |

EXAMPLE 21

The sample used in Example 1 was exposed to light by scanning with an argon ion laser. The laser beam having a wavelength of 488 nm was focused on the sample surface at a beam diameter of 15 μm so that the sample was exposed to light under conditions of a light intensity of 15.7 mW and a scanning speed of 51.3 m/sec. Thereafter, the development as in Example 1 was effected to obtain cured lines having a width of 15 μm.

References 1-3

The stock solution used in Example 1 was admixed with 5 wt. % of each of ordinary photopolymerization initiators and further with 5 wt. % of thiol c-1, thereby comparing their sensitivities with one another. The results are shown in Table 6.

TABLE 6

|  | Photopolymerization Initiator | Effect of c-1 |
|---|---|---|
| Reference 1 | benzoin methyl ether | lowering of sensitivity by 0.5 step |
| Reference 2 | 2-ethylanthraquinone | lowering of sensitivity by 6 steps |
| Reference 3 | benzil + Michler's ketone | no change in sensitivity |

Having now fully described this invention, it will be apparent to one of ordinary skill in the art that many changes and modifications can be made thereto without departing from the spirit or scope of the invention as set forth herein.

What is claimed as new and intended to be covered by Letters Patent is:

1. A photopolymerizable composition, which comprises:
   the combination of an addition-polymerizable compound having at least one ethylenically unsaturated double bond and a photopolymerization initiator system consisting essentially of:
   (a) a p-dialkylaminostyrene derivative or p-dialkylaminophenylbutadiene derivative of the formula:

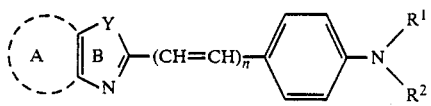

wherein $R^1$ and $R^2$ each independently is an alkyl group, Y is a divalent atom or member selected from the group consisting of —O—, —S— and —CH=CH— and forms an aromatic heterocyclic ring B together with the trivalent nitrogen atom, and ring A represents a benzene ring or naphthalene ring condensed with ring B, and n is 1 or 2;
   (b) a hexaarylbiimidazole; and
   (c) a thiol compound of the formula:

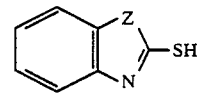

wherein Z represents a divalent atom or member selected from the group consisting of —O—, —S—, —NH— and

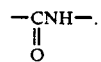

2. The composition of claim 1, wherein said addition-polymerizable compound is an unsaturated carboxylic acid, an ester of an unsaturated carboxylic acid and an aliphatic polyhydroxy compound, an ester of an unsaturated carboxylic acid and an aromatic polyhydroxy compound, or an ester obtained by the reaction of an unsaturated carboxylic acid and a polycarboxylic acid with a polyhydroxy compound.

3. The composition of claim 2, wherein said ester of an aliphatic polyhydroxy compound and an unsaturated carboxylic acid is ethyleneglycol diacrylate, triethyleneglycol diacrylate, trimethylolpropane triacrylate, trimethylolethane triacrylate, pentaerythritol diacrylate, pentaaerythritol triacrylate, pentaerythritol tetraacrylate, dipentaerythritol tetraacrylate, dipentaerythritol pentaacrylate, dipentaerythritol hexaacrylate, glycerol acrylate, triethyleneglycol dimethacrylate, trimethylolpropane trimethacrylate, trimethylolethane trimethacrylate, pentaerythritol dimethacrylate, pentaerythritol trimethacrylate, pentaerythritol tetramethacrylate, dipentaerythritol dimethacrylate, dipentaerythritol trimethacrylate, dipentaerythritol tetramethacrylate, ethyleneglycol diitaconate, tetramethyleneglycol diitaconate, pentaerythritol triitaconate, ethyleneglycol dicrotonate, diethylene glycol dicrotonate, pentaerythritol tetracrotonate, ethyleneglycol dimaleate, triethyleneglycol dimaleate or pentaerythritol dimaleate.

4. The composition of claim 2, wherein said ester of an aromatic polyhydroxy compound and an unsaturated carboxylic acid is hydroquinone diacrylate, hydroquinone dimethacrylate, resorcin diacrylate, resorcin dimethacrylate, or pyrogallol triacrylate.

5. The composition of claim 2, wherein said ester formed by the reaction of an unsaturated carboxylic acid, a polycarboxylic acid and a polyhydroxy compound is the condensate of acrylic acid, phthalic acid and ethylene glycol, the condensate of acrylic acid, maleic acid and diethylene glycol, the condensate of methacrylic acid, terephthalic acid and pentaerythritol or the condensate of acrylic acid, adipic acid, butanediol and glycerol.

6. The composition of claim 1, wherein the addition-polymerizable compound is an acrylate or methacrylate.

7. The composition of claim 1, wherein said p-dialkylaminostyrene derivative is 2-(p)-dimethylaminostyryl)benzothiazole, 2-(p-diethylaminostyryl)benzothiazole, 2-(p-dimethylaminostyryl)benzoxazole, 2-(p-diethylaminostyryl)benzoxazole, 2-(p-dimethylaminostyryl)benzo[4,5]benzothiazole, 2-(p-diethylaminostyryl)benzo[4,5]benzothiazole, 2-(p-diethylaminostyryl)benzo[6,7]benzothiazole, 2-(p-dimethylaminostyryl)quinoline, 2-(p-diethylaminostyryl)quinoline, or 2-(p-diethylaminostyryl)benzo[4,5]benzoxazole, and wherein said dialkylaminophenylbutadiene derivative is 2-[4-(p-dimethylaminophenyl)-1,3-butadienyl]benzothiazole, 2-[4-(p-diethylaminophenyl)-1,3-butadienyl]benzothiazole, 2-[4-(p-di-n-butylaminophenyl)-1,3-butadienyl]benzothiazole, 2-[4-(p-dimethylaminphenyl)-1,3-butadienyl]benzo[6,7]benzothiazole or 2-[4-(p-diethylaminophenyl)-1,3-butadienyl]benzo[4,5]benzothiazole.

8. The composition of claim 1 wherein said p-dialkylaminostyrene derivative is 2-(p-dialkylaminostyryl)benzo[4,5]benzothiazole, 2-(p-dialkylaminostyryl)benzothiazole or 2-(p-dialkylaminostyryl)benzoxazole.

9. The composition of claim 1, wherein said hexarylbiimidiazole is 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl-4,4',5,5'-tetra(m-methoxyphenyl)biimidazole, 2,2'-bis,(o,o,-dichlorophenyl)-4',4',5,5'-tetraphenylbiimidazole, 2,2 -bis(o-nitrophenyl)-4,4',5,5 -tetraphenylbiimidazole or 2,2-bis(o-methylphenyl)-4,4',5,5'-tetraphenylbiimidazole.

10. The composition of claim 1, wherein said thiol compound is 2-mercaptobenzothiazole, 2-mercaptobenzoxazole, 2-mercaptobenzimidazole or 2-mercapto-4(3H)quinazolinone.

11. The composition of claim 1, wherein the amounts of said ingredients (a), (b) and (c) range from 0.1–10 parts by weight, 0.5–30 parts by weight and 0.1–20 parts by weight respectively per 100 parts by weight of said addition-polymerizable compound.

12. The compound of claim 11, wherein the amounts of ingredients (a), (b) and (c) range from 1–7 parts by weight, 2–15 parts by weight and 1–15 parts by weight respectively per 100 parts by weight of said addition-polymerizble compound.

13. The composition of claim 1, wherein said composition further contains a binder.

14. The composition of claim 1, wherein said composition further comprises at least one member selected from the group consisting of thermal polymerization inhibitors, colorants, plasticizers, surface protecting agents, smoothing agents, and application aids.

15. The composition of claim 1, wherein said photopolymerization composition is applied to a substrate selected from the group consisting of a metal sheet, a paper sheet, a release paper, a glass, a ceramic, and a polymer sheet.

16. The composition of claim 1, wherein said photopolymerizable composition exhibits high sensitivity to visible light.

17. The composition of claim 16, wherein said visible light has a wavelength of 488 nm or 436 nm.

* * * * *